United States Patent [19]
Fujita et al.

[11] Patent Number: 4,670,292
[45] Date of Patent: Jun. 2, 1987

[54] METHOD FOR INJECTING EXOTIC ATOMS INTO A SOLID WITH ELECTRON BEAMS

[75] Inventors: Hiroshi Fujita, Ibaraki; Naoto Sumida, Osaka, Japan

[73] Assignee: Osaka University, Suita, Japan

[21] Appl. No.: 776,520

[22] Filed: Sep. 16, 1985

[30] Foreign Application Priority Data

Feb. 27, 1985 [JP] Japan .................. 60-36614

[51] Int. Cl.⁴ .............................................. B05D 3/06
[52] U.S. Cl. .................................... 427/35; 250/472.3
[58] Field of Search ........................ 427/35; 250/492.3

[56] References Cited

U.S. PATENT DOCUMENTS 2,911,533 11/1959 Damask ........................... 250/492.3
3,718,502 2/1973 Gibbons .............................. 148/191

OTHER PUBLICATIONS

Dienes et al. "Radiation Effects in Solids" Interscience Publishers Inc., New York (1975) pp. 58-60, 77-79, 82, 83 and 90-92.

Primary Examiner—John H. Newsome
Attorney, Agent, or Firm—Spencer & Frank

[57] ABSTRACT

A method for injecting exotic atoms into a solid with electron beams comprises irradiating a material having structure of two layers to which at least one thin film adheres with electron beams, and injecting the exotic atoms into an irradiation region. This method gives desired forms such as crystal, noncrystal, solid solution of the materials, depending on the conditions of electron irradiation.

12 Claims, 3 Drawing Figures

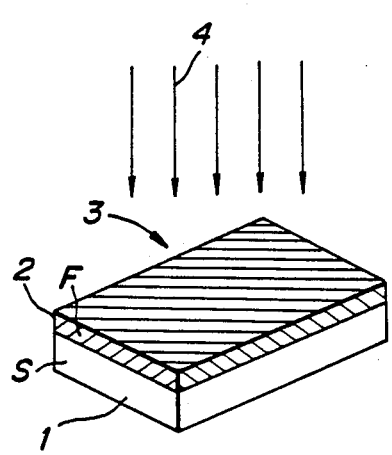
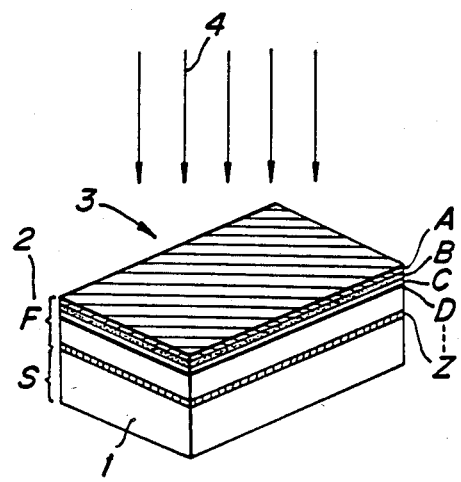
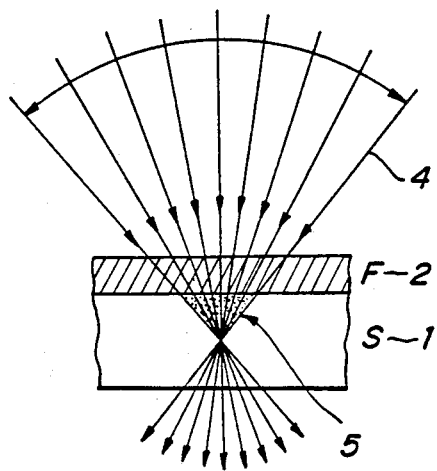

METHOD FOR INJECTING EXOTIC ATOMS INTO A SOLID WITH ELECTRON BEAMS

BACKGROUND OF THE INVENTION

1. Field of the Invention

This invention relates to a method for injecting exotic atoms into a solid with electron beams (injection of atoms induced with electron beams) in the fields of material engineering and electron beam engineering.

2. Background of the Art

In the field of material engineering, various composite materials have been developed in search of high additional value for materials having new functions and conventional materials.

Conventional methods producing the composite materials are classified roughly as follows:

(I) The composite materials are obtained by joining of independent materials by any method (welding, electrodeposition, thermal diffusion, adhesives or these combinations).

(II) The composite materials are obtained by heat-treating or mechanical treating alloys of two phases or multiple phases.

(III) Ions are implanted into a material with ion beams.

(IV) Exotic atoms added to the surface of materials are injected into the materials by beam-annealing while electron beams or laser beams are used as a heat source.

In the method of (I), it is generally difficult to obtain an intersurface which joins properly. As a result, the characteristic properties of the joined interface are not controllable. Therefore, the production of composite materials having a super fine structure of about 1–10 nm$\phi$ is impossible. These disadvantages are inevitable.

In the method of (II), as alloy phases which are stable or stable to some extent in an equilibrium state are used, it is difficult to develop materials having epochal functions. Further, it is difficult to control optionally the dimension, numbers and conditions of distribution of deposit phases.

In the method of (III), there are some disadvantages accompanied with ion beams: shallow implantation depth of exotic atoms, large damage of materials irradiated with ion beams, difficulty of control of dimensions of mixed phase regions, etc.

In the method of (IV), there are also some disadvantages. For example, it is difficult to control dimensions of mixed phase regions and distribution of concentration of surface, and heat distortion of the surface is great, etc.

SUMMARY OF THE INVENTION

For dissolving the above disadvantages, this invention provides a material having a structure of two layers: a solid material and a thin film. Thin films which contain at least one element component to be injected into the solid material are provided on the solid material of the substrate by the method of vacuum deposition, sputtering, beam annealing electrodeposition, etc. When the material having the two-layered structure is irradiated from the side of the thin layer with electron beams having high energy which is greater than the threshold energy for displacing the atoms contained in the thin film, these atoms move into the solid material. This movement does not result in thermal diffusion. As a result, the atoms contained in the thin film are injected into the solid material of the substrate. Then, a mixed layer of the atoms is produced near the interface limited to the small region where the electron beams are irradiated.

This invention provides a method of producing a composite material which forms a mixed layer having combination, composition, dimension and distribution of the aimed atoms by controlling the mixed layer which consists of atoms of the solid materials of the substrate and atoms of the thin film from the region irradiated by the electron beams.

Using this method for producing the composite material, many disadvantages contained in the above conventional methods are dissoluble. Further, composite materials having new functions are efficiently developed by the method using irradiation with electron beams.

BRIEF DESCRIPTION OF THE DRAWING

FIGS. 1(a) and 1(b) are schematic perspective views of examples of the method of this invention:

1(a) shows a condition of irradiating a material having a two layer sturcture from the side of a thin film with electrons of high energy. The material consists of a solid material (S) as the substrate and a thin film (F) in which elemental components (A, B, C, . . . ) to be injected into the solid material are contained.

1(b) shows a condition of irradiating a material in a similar manner as above in FIG. 1(a). In this case, the material consists of a solid material (S) as the substrate and several thin films (F). Each thin film contains one kind of the elemental component and is identified as A, B, C, D, . . . , Z.

FIG. 2 is a schematic sectional view showing a method for controlling the distribution of concentration of injected atoms by controlling the intensity of the electron beams.

DESCRIPTION OF THE PREFERRED EMBODIMENTS

In FIG. 1, a thin film (F) 2 containing several element components (A, B, C, . . . ) which are to be injected into a solid material (S) 1 is attached to the solid material (S) 1 of the substrate by one of the methods of vacuum deposition, sputtering, beam annealing, electrodeposition, etc. The obtained material is an F-S material having a two layer structure shown generally by the arrow 3.

When electron beams 4 having undermentioned energy are irradiated on the F-S material having a two layer structure 3 from the side of the thin film 2 at given conditions of intensity, angle of incidence and angle of reflection of the electron beams, irradiation temperature and irradiation time, electrons collide against atoms A, B, C, . . . in the thin film (F) to displace the positions of the atoms. As a result, these atoms transfer to the interface of F and S and enter into the solid material (S). Then, a mixed layer of these atoms is produced. The transfer of the atoms does not result in thermal diffusion.

In this case, the electron beams used for the irradiation must have sufficient energy to displace all atoms which are contained in the thin film (F). However, depending on the kinds of composite materials which are produced, when the material is irradiated with electron beams having a high energy which exceeds the threshold energy for displacing the atoms contained in the solid material (S) of the substrate, the atoms are diffused by the enhanced irradiation so that the mixed layer is efficiently produced. Further, when load stress is applied to the F-S material having a two layer structure during irradiation and while the F-S material is heated, an effect similar to that described above is obtained.

Kinds, components, form, dimensions, etc. of the mixed layer which is formed in the solid material (S) of the substrate can be changed by suitable selection of the energy of the electron beams, diameter of the beams, intensity, irradiation temperature and irradiation time, etc.

Further, as shown in FIG. 2, intensity of the electron beams in the solid material (S) may be controlled by convergence or divergence of the electron beams, or by continuous changes to the angles of incidence, whereby the distribution of concentration of atoms which are injected in the direction of thickness of an F-S mixed layer 5 is varied. According to this method, the concentration of the exotic atoms injected as shown in FIG. 2 can be controlled in the direction of depth at the same time as the dimensions of the region are controlled.

The solid materials which are useful in this invention are semiconductor materials, ceramic materials, metal materials, etc. According to this method, desired forms, such as crystals, noncrystals, and solid solutions of the materials, are obtained depending on the conditions by the irradiation of electron beams.

Accordingly, this invention is applicable to the following products.

(1) Various electron materials whose dimension, concentration, form and depth are exactly controlled by injection of exotic atoms in the unit of several nm.
(2) Various composite materials in which exotic atoms or exotic alloys are controlled in any form, concentration, dimension and depth and these are evenly distributed by connecting well with the other materials.
(3) Materials amorphized by injection of supersaturation of exotic atoms.
(4) New materials having tissues which are unexpected from the phase diagrams.

In this invention, exotic atoms are injected into the solid substrate with electron beams having high energy, so that the produced composite materials have the following advantages.

(1) The diameter of electron beams can be easily changed with an electron lens. The value of the diameter can be minimized to about 1 nm$\phi$. As a result, electron materials and composite materials having extremely fine structure can be produced.
(2) As the diameter of the electron beams and the places irradiated can be easily controlled with the electromagnetic field, the form of parts having injected the exotic atoms can be freely changed. Further, various figures containing fine figures haing nm widths can be directly drawn satisfactorily.
(3) As the electron beams have a great percent transmission, mixed layers having about 0.1 mm in thickness can be obtained.
(4) As the mixed layers can be produced by irradiation in short times, the composite materials can be rapidly obtained.
(5) When the conditions of energy of the electron beams, control of irradiation angles, reduction means of the aperture of the beams, irradiation temperature, etc. are properly selected, the concentration distribution of injected atoms can be optionally controlled.
(6) When the mixed layer and the substrate are connected at the interface between the mixed layer and the solid material (S) of the substrate, inherent properties of the interface can be controlled.
(7) As the mixed layer is produced without using thermal diffusion, an alloy layer which is absent in the equilibrium state can be obtained.

The embodiment examples of conditions of irradiation are shown in the following table. By these conditions, a mixed layer consisting of thin layers (F) and solid material (S) can be obtained by the method of this invention.

TABLE

| Material | | Energy of | Intensity of | Irradiation | Irradiation | Produced |
| thin film (F) | solid (S) | electron beams | electron beams | temperature | time | mixed layer |
| --- | --- | --- | --- | --- | --- | --- |
| Pd | Si | 2.4 MeV | $1 \times 10^{20}$ e/cm$^2 \cdot$ sec | 20° C. | 30 min | Pd$_2$Si |
| Au | Si | 2.5 MeV | $1 \times 10^{20}$ e/cm$^2 \cdot$ sec | 110° C. | 15 min | Amorphous material (easily crystallized by heating |

The effects of this invention:

(A) When the method of this invention is used, mixed layers having any thickness of maximum several nm can be produced by the combination of this method and the other methods. Further, as the connection between the thin film and the solid material is good, development of materials having new functions can be expected.

(B) The diameter of electron beams can be easily changed with an electron lens. The value of the diameter can be minimized to about 1 nm$\phi$. Hence, composite materials having extremely fine structures of the complex material can be directly produced. Further, dimensions, form and distribution of the mixed layers can be optionally controlled.

(C) When the electron beams used in the irradiation have higher energy than the energy which is used for the displacement of the atoms in the solid material (S), point defects are introduced by the irradiation into the solid material (S). As the point defects enhance the diffusion velocity, the exotic atoms which are injected into the solid can transfer at a distance. Accordingly, by the synergic effect of the great penetration of the electron beams and the enhanced diffusion depending on the produced point defects, the thickness of the mixed layers can be easily increased to several nm. If the solid material (S) is a single crystal, the channeling phenomenon of the electrons having high energy can be used. As a result, the penetration becomes greater so that thick mixed layers can be produced. When the material is irradiated under the condition in which stress is applied, the diffusion of point defects is enhanced or reduced in the specified direction, so that the thickness of the mixed layers can be easily controlled.

What is claimed is:

1. A thermal diffusion-free method for injecting exotic atoms into a solid substrate using an electron beam, the method comprising:

providing a structure consisting of a solid substrate and a thin film comprised of at least one type of exotic atom provided on one surface of said solid substrate; and irradiating a predetermined region of said structure with an electron beam directed toward said thin film to cause aimed displacement of at least one type of said at least one type of exotic atom from said thin film into said solid substrate to provide a zone of mixed atoms in the irradiated region, said zone of mixed atoms having a concentration of said at least one type of displaced exotic atom which ranges up to supersaturation and is independent of the thermal equilibrium state, said electron beam having an energy which is greater than the threshold energy for the at least one type of displaced exotic atom, and said irradiation taking place at an irradiation temperature which is below that at which thermal diffusion takes place.

2. The method according to claim 1, wherein the irradiation temperature does not exceed 110° C.

3. The method according to claim 1, wherein the irradiation temperature does not exceed 20° C.

4. The method according to claim 1, wherein irradiation of said predetermined region with an electron beam is achieved by providing a controllable electromagnetic field and at least one electron lens for said electron beam.

5. The method according to claim 1, wherein intensity of the electron beam is controlled by one or more of controlling the convergence, the divergence, and the angle of incidence of the electron beam, whereby the concentration distribution of the at least one type of displaced exotic atom in said zone of mixed atoms is variable.

6. The method according to claim 1, wherein said electron beam has an energy which is greater than the threshold energy for at least one type of atom of the solid substrate whereby solid substrate atoms are also displaced.

7. A thermal diffusion-free method for injecting exotic atoms into a solid substrate using an electron beam, the method comprising:

providing a structure consisting of a solid substrate and a plurality of thin films provided on one surface of said solid substrate, each of said plurality of thin films consisting of one type of exotic atom, which types of exotic atoms differ between adjacent layers; and irradiating a predetermined region of said structure with an electron beam directed toward said plurality of thin films to cause aimed displacement of at least one type of exotic atom from said plurality of thin films into said solid substrate to provide at least one zone of mixed atoms having a concentration of said at least one type of displaced exotic atom which ranges up to supersaturation and is independent of the thermal equilibrium state, said electron beam having an energy which is greater than the threshold energy for the at least one type of displaced exotic atom, and said irradiation taking place at an irradiation temperature which is below that at which thermal diffusion takes place.

8. The method according to claim 7, wherein the irradiation temperature does not exceed 110° C.

9. The method according to claim 7, wherein the irradiation temperature does not exceed 20° C.

10. The method according to claim 7, wherein irradiation of said predetermined region with an electron beam is achieved by providing a controllable electromagnetic field and at least one electron lens for said electron beam.

11. The method according to claim 7, wherein intensity of the electron beam is controlled by one or more of controlling the convergence, the divergence, and the angle of incidence of the electron beam, whereby the concentration distribution of the at least one type of displaced exotic atom in each of said at least one zone of mixed atoms is variable.

12. The method according to claim 7, wherein said electron beam has an energy which is greater than the threshold energy for at least one type of atom of the solid substrate whereby solid substrate atoms are also displaced.

* * * * *